United States Patent [19]

Wong

[11] Patent Number: 4,483,347

[45] Date of Patent: Nov. 20, 1984

[54] METHOD AND APPARATUS FOR DISPLAYING ELECTROCARDIOGRAPHIC SIGNALS

[75] Inventor: Alan S. Wong, Escondido, Calif.

[73] Assignee: Del Mar Avionics, Irvine, Calif.

[21] Appl. No.: 356,326

[22] Filed: Mar. 10, 1982

[51] Int. Cl.³ .................................................. A61B 5/04
[52] U.S. Cl. ..................................................... 128/712
[58] Field of Search ................................. 128/710–712

[56] References Cited

U.S. PATENT DOCUMENTS

| | | | |
|---|---|---|---|
| 3,434,151 | 3/1969 | Bader et al. | 128/712 |
| 3,585,988 | 6/1971 | Creigh et al. | 128/712 |
| 3,779,237 | 12/1973 | Goeltz et al. | 128/710 |
| 3,960,140 | 6/1976 | Buxton | 128/712 |
| 3,995,259 | 11/1976 | Harris et al. | 128/712 |
| 4,073,011 | 2/1978 | Cherry et al. | 128/711 |

Primary Examiner—William E. Kamm

Attorney, Agent, or Firm—Beehler, Pavitt, Siegemund, Jagger & Martella

[57] ABSTRACT

An improved system for displaying annotated physiological signals processes the signals for two-dimensional display on an oscilloscope, for annotation with time-of-day and patient information, and for marking relative to a plurality of detected, abnormal physiological events. The physiological signal is traced during a first time interval after which the time-of-day and patient information is annotated appropriately on the display during a second time interval. During a third time interval, the display is marked to identify those physiological events which have been detected by the system as being abnormal. The display is created with maximum fidelity and without loss of signal information by this three pass process. Two independent channels of physiological signals are displayed on alternate horizontal lines in the display, again without loss of signal fidelity, by tracing the first channel during a first sweep and simultaneously storing the second channel within a memory for display during a second sweep.

10 Claims, 7 Drawing Figures

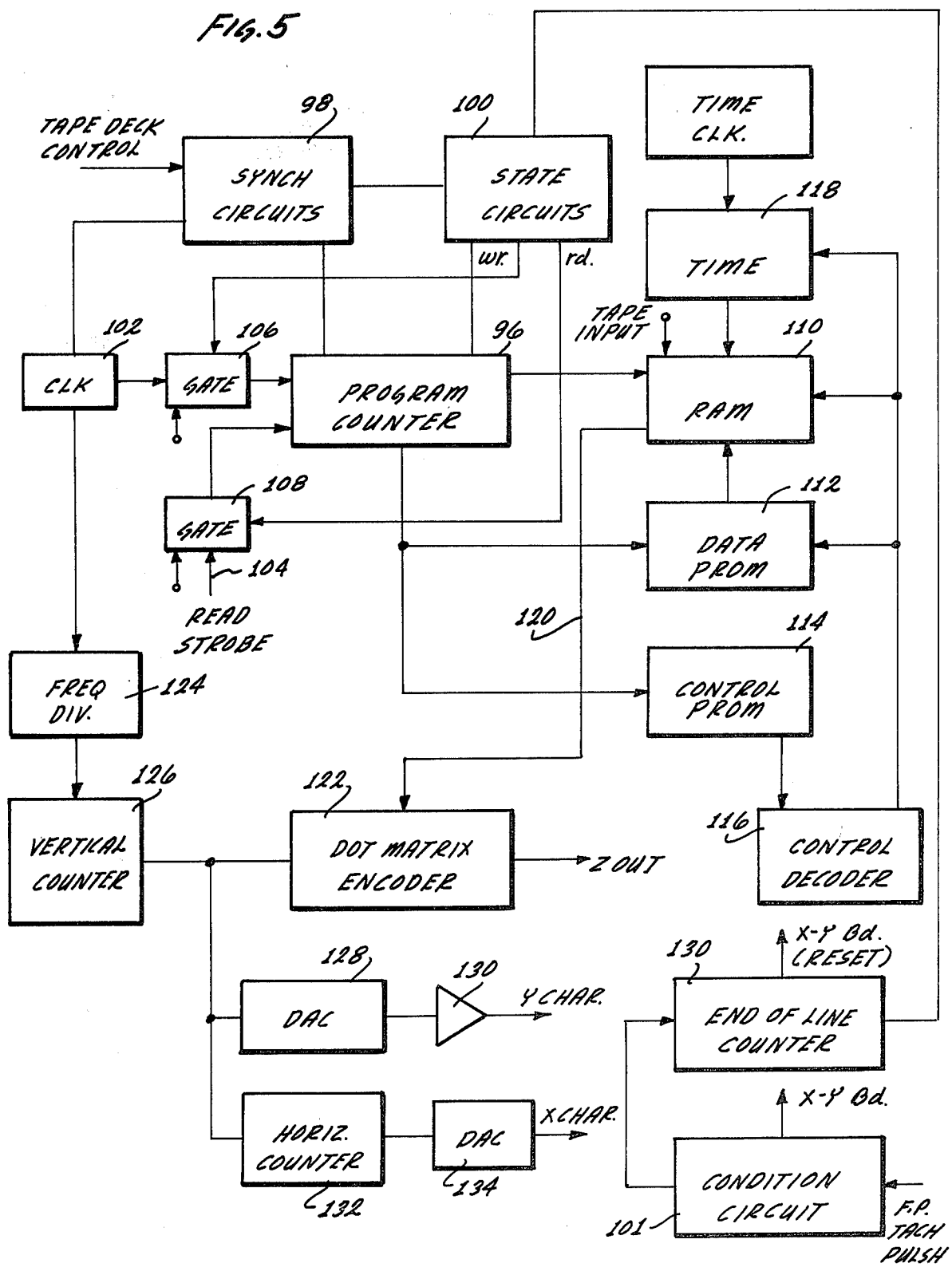

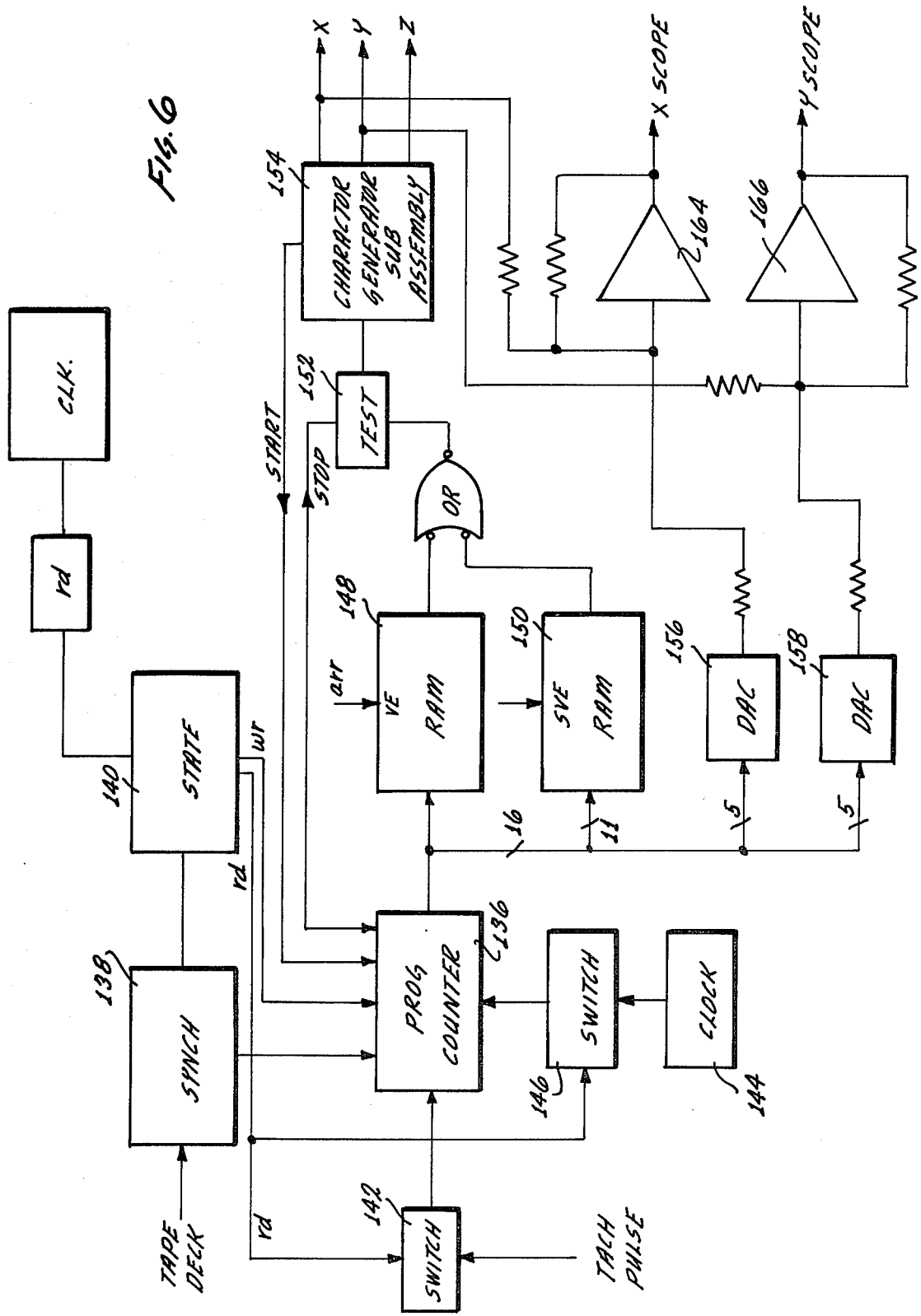

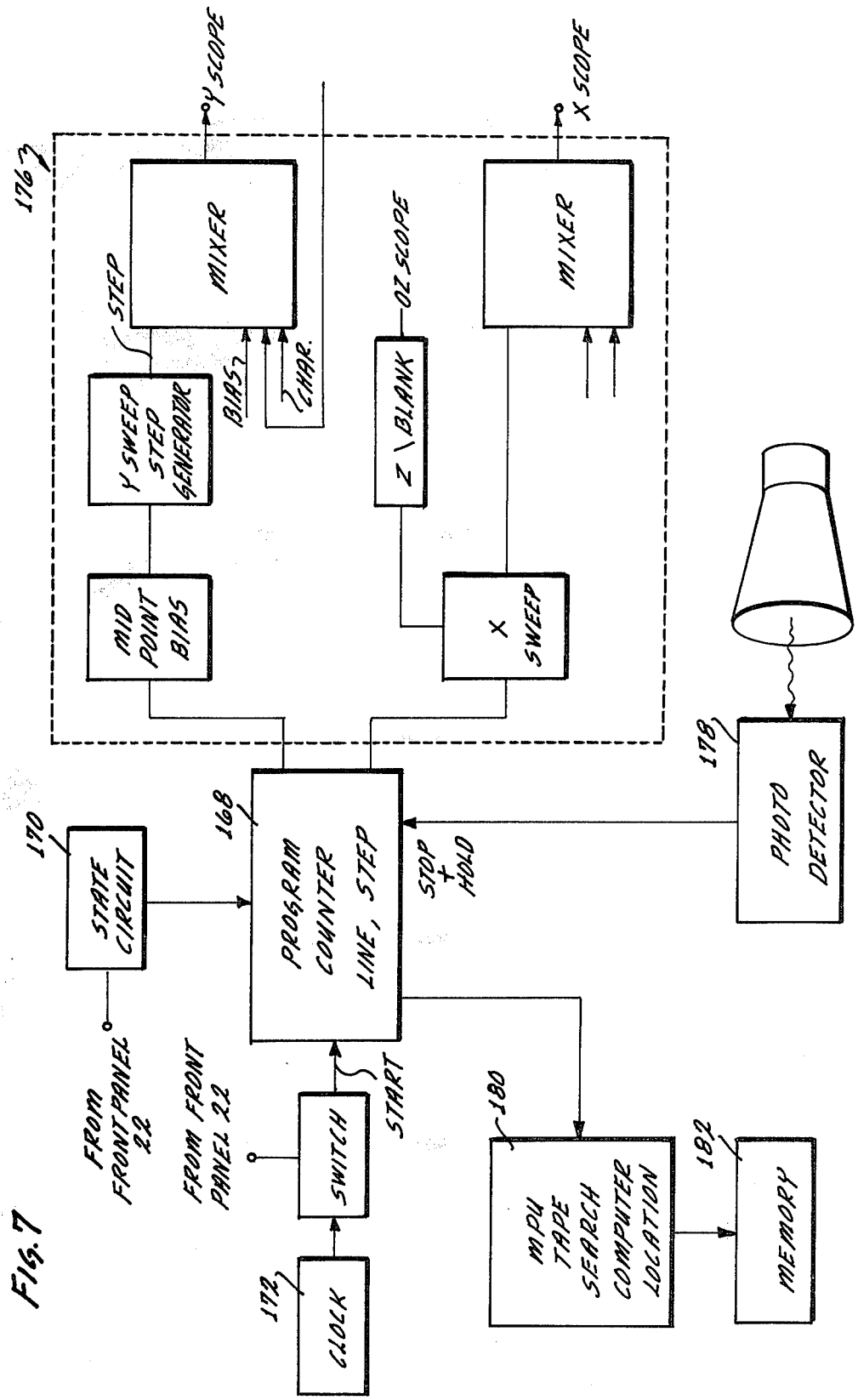

METHOD AND APPARATUS FOR DISPLAYING ELECTROCARDIOGRAPHIC SIGNALS

BACKGROUND OF THE INVENTION

1. Field of the Invention

The present invention relates to methodology and apparatus for monitoring, analyzing and displaying large amounts of physiological data or waveforms, and in particular relates to the methodology and apparatus for monitoring, analyzing and displaying ambulatory ECG waveforms.

2. Description of the Prior Art

Video analysis systems for monitoring, analyzing and displaying ECG waveforms were pioneered by Holter et al., examples of which is shown in Holter, U.S. Pat. No. 3,215,136 and U.S. Pat. No. 3,229,687. These types of prior art devices attempted to superimpose multiple ECG signals one on top of the other to facilitate the detection of an abnormal ECG waveform as compared to a plurality of normal waveforms.

Subsequent to these early monitoring and display devices, assignee of the present invention developed video display units capable of presenting a plurality of ECG signals in a two dimensional array on a cathode ray tube, for example see Cherry, U.S. Pat. No. 4,006,737; Cherry et al., U.S. Pat. No. 4,073,011; and U.S. Pat. No. 4,123,785. More recently practitioners in the field have developed an automated system for displaying ECG waveforms read at an accelerated rate from a tape deck in a two dimensional format on a CRT display wherein two channels of information are read and multiplexed upon the display, see for example Gessman, U.S. application Ser. No. 74,475 now issued. However, such prior art devices are able to produce multiple channels of ECG waveform in a CRT display with poor fidelity. Moreover, the flexibility of such prior art systems with respect to annotating and marking abnormal beats in the display are severely limited.

What is needed are improvements to such prior art systems which will generate high fidelity reproductions of multiple channels of ECG waveforms read at accelerated rates from a storage media, such as magnetic tape, which allows not only for increased flexibility and capability with respect to annotation and marking of the displayed waveforms, but inherently allows a greater flexibility and user control of a plurality of display formats.

BRIEF SUMMARY OF THE INVENTION

The present invention is an improvement in a system for displaying annotated physiological signals wherein the signals are reproduced on an oscilloscope display from a fixed medium at a rate substantially greater than the rate at which the signals occurred in real time. The system displays annotated portions of the signals according to a plurality of display formats. The physiological signals are annotated relative to a plurality of detected physiological events which are detected by the system and are annotated with distinguishable markers. The improvement comprises a means for receiving, processing and displaying the signals in one of the plurality of formats during a first time interval on the oscilloscope display when the signals are initially read from the fixed medium. A means for annotating the signals is provided to annotate the signals with a parameter according to one of the display formats during a second time interval which is subsequent to the first time interval. Finally, a means for marking the signals is provided wherein the means for marking does so in the selected format and identifies a plurality of detected physiological events corresponding to a selected portion of the physiological signals received and processed. The signals are marked during a third time interval which is subsequent to the first time interval. The means for receiving, processing and displaying, the means for annotating and the means for marking are each innerconnected in order to coordinate the displaying, annotating and the marking of the physiological signals and the selected one of the display formats. By reason of this combination an annotated and marked display of physiological signals, waveforms corresponding to a long period of time can be displayed, analyzed and marked in a substantially shorter period of time by a system having minimum complexity.

The invention also includes an improvement in a system having an oscilloscope display with an x and y-sweep input signal. The system is used for displaying a selected one of a plurality of output formats on the oscilloscope. The improvement comprises a control means for selectively generating a plurality of control signals corresponding to the selected output format. An encoder means is coupled to the control means and is used for generating a binary word corresponding to the selected output format. Finally a generator is coupled to the encoder means and is used for generating a plurality of sweep signals which are responsive to the binary word. The generator generates a selected one of a plurality of signals, which selected sweep signal corresponds to the selected output format and serves as one of the x or y-sweep signals. By this combination of elements it is possible to use a single generator to generate as many different sweep signals as the maximum magnitude representable by the binary word.

The invention can also be characterized as an improvement in a method for displaying annotated physiological signals on a single beam oscilloscope at a rate substantially greater than the rate at which the signals occur in real time. Physiological signals are annotated relative to a plurality of detected physiological events and displayed in one of a plurality of display formats. The improvement comprises the steps of receiving, processing and displaying the signals during a first time interval on the oscilloscope. The signals are displayed in one of the plurality of display formats. The signals are then annotated with a parameter, such as time of day, according to the selected display format during a second time interval. Finally the signals are marked according to the selected display format to identify a plurality of the detected physiological events during a third time interval. By reason of this improved methodology an annotated and marked display of physiological signals can be displayed on a single beam oscilloscope with minimal circuit complexity and maximal fidelity. Fidelity is not sacrificed by the need or capability to display a plurality of channels, or by the annotation or marking.

These and other embodiments of the present invention can better be understood by viewing the following Figures wherein like elements are referenced by like numerals.

BRIEF DESCRIPTION OF THE DRAWINGS

FIG. 5 is a more detailed block diagram of the circuitry included within the character generator of FIG. 1 used for waveform annotation.

FIG. 6 is a simplified block diagram of circuitry used to generate a waveform marker, which marker circuitry is also included within the character generator of FIG. 1.

FIG. 7 is a simplified block diagram of a light pen circuit included as part of the x and y drive circuitry of the system illustrated in FIG. 1.

DETAILED DESCRIPTION OF THE PREFERRED EMBODIMENTS

The present invention are improvements in a video presentation system which displays and analyzes physiological parameters in a system manufactured and marketed by the assignee of the present invention. The video presentation system allows a doctor or technician to scan twenty-four hours of a patient's ambulatory ECG recordings typically stored in a fixed medium such as magnetic tape or discs. The user can arbitrarily display a five, ten or sixty minute segment of continuous ECG signals on a large CRT storage oscilloscope. Either one or two independent channels of the ECG waveforms may be displayed in a two dimensional array comprised of successive lines of the continuous waveforms as measured in time, beginning at the top of the oscilloscope display and proceeding from left to right and from top to bottom in time. Ectopic events are recognized and corrolated with their time of occurrence by particularly marking each abnormal ECG waveform. In addition, patient identification information or other file information is printed across the top of the display together with time annotated signals along the left hand margin of the display to facilitate the identification of the exact time of day at which any ECG signal or abnormality was exhibited. A tape search mode permits automatic, rapid location and display of arbitrarily selected ECG events either in a fifteen second two-channel mode or in a five minute single channel mode. An autoscan mode of operation automatically provides continuously updated ECG page displays of the entire twenty-four hour ECG recording. Hardcopy printouts of each display as it appears on the screen may also be produced in the auto report mode. Finally, a random access mode allows the use of a light pen to arbitrarily pick out any point on the waveform display for further amplification or for display of the selected event in a different format.

Although the present invention is illustrated in terms of ECG waveforms and two-channel displays, it must be understood that any physiological signal could be read from a fixed medium displayed by the present invention and that a different plurality of channels could be accommodated as well.

Figure 1:
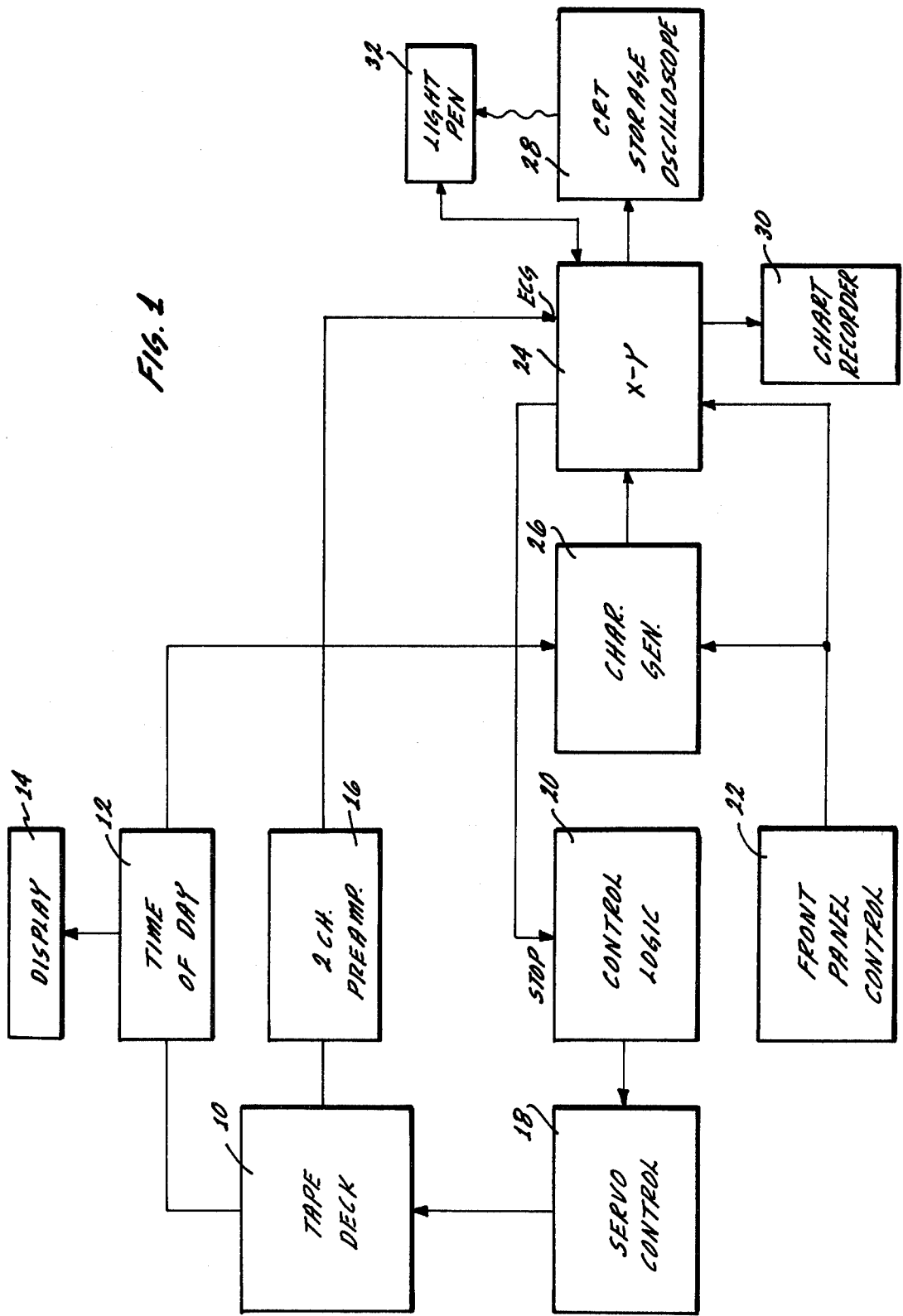
FIG. 1 is a simplified diagramatic view of the system organization of the present invention wherein physiological signals are read from a two channel tape deck and displayed on a CRT storage oscilloscope.

FIG. 1 illustrates a simplified block diagram of the overall architecture of the system. The ambulatory ECG signals recorded on magnetic tape are read by a conventional two-channel tape deck 10. Tape deck 10 includes a standard optical encoder which generates a tachometer signal indicative of the tape speed. The tachometer signal is used throughout the circuitry of FIG. 1 wherever timing or synchronization of operation to the tape speed is required. The circuitry of the present invention is designed to operate at a plurality of tape playback speeds according to arbitrary user selection and utilizes the tachometer signal according to well understood principles to effect this.

Time-of-day circuitry 12 is coupled to tape deck 10 and utilizes the tachometer signal to generate a time-of-day signal. The time-of-day signal may be digitally encoded on the magnetic tape or may be manually entered through a series of push button switches included as part of circuitry 12 when the tape is first started. In either case, the time-of-day of any event recorded on the tape is calculated by circuitry 12 according to conventional means from a given starting time. Circuitry 12 is coupled to an LED display 14 which displays the time-of-day of the event then being read by tape deck 10.

The data output from tape deck 10 is coupled to a conventional two-channel preamplifier 16 which conditions the voltage and current of the input ECG signals according to the requirements of the remaining portions of the system's circuitry.

Tape deck 10 is controlled by a conventional servo-control circuit 18 which in turn is controlled by control logic circuitry 20, again designed according to well known principles. Control logic circuitry 20 in turn takes part of its inputs from the front panel control 22 which has a plurality of manual, user inputs. Front panel control circuitry 22 may contain additional conditioning circuitry as may be required, again according to well understood design principles, by which the user selects the mode of operation and the display format which he desires. In addition, front panel control circuitry 22 could include a plurality of indicators or displays showing the total number of heartbeats displayed, the real time elapsed between the first and last display heartbeat, and the number of abnormal beats per category which may occur in the display.

The abnormal beats are detected and classified according to an arrhythmia computer (not shown) of the type previously developed by assignee and as is now known in the art. The arrhythmia computer has not been explicitly shown in FIG. 1 for the sake of clarity but may be thought of as being included in the x-y drive board 24 and coupled appropriately to each of the described circuit blocks by discrete command lines which have been omitted from the Figures for the sake of simplicity and clarity of illustration.

The time annotations, character annotations such as relating to patient identity and file identification, and the marking of abnormal beats according to the present invention are implemented by circuitry included as part of character generating circuitry 26. Character generating circuitry 26 is thus coupled to time-of-day circuitry 12, front panel control circuitry 22, and the x-y drive board 24. X-y drive board 24 is also coupled to front panel control 22 so that appropriate x-y signals can be generated according to the selected display format, according to the character annotation or time annotation required, and according to the abnormal marking parameter required, all in coordination with the multiple channels of ECG data from preamp 16. The synthesized x-y output is then coupled to a conventional storage oscilloscope 28 for display. The reading of data from magnetic tape by tape deck 10 is also indirectly controlled by x-y drive board 24 through control logic circuitry 20 and servo-control 18. Thus, once the display format has been selected by the user through front panel control 22, x-y drive board 24 will trace the selected portion of the ECG waveforms on storage oscilloscope 28 as read from the magnetic tape and tape deck 10, and then generate a stop signal after the display is full to stop tape deck 10. The stop signal is coupled from x-y drive board 24 through control logic 20 to servo-control 18.

The output of x-y drive board 24 may also be coupled to a conventional chart recorder 30 in a data format compatible therewith and compatible with the selected display format chosen by the user. In addition, a light pen and light pen circuitry 32 may be used in combination with storage oscilloscope 28 to randomly access any point within the displayed signals for further display according to a second chosen format. Thusly, light pen circuitry 32 is coupled to x-y drive board 24 which, commanded appropriately by front panel control 22, will generate a display with an appropriate format on storage oscilloscope 28 based upon the selected event identified by the user with the use of light pen circuitry 22. The light pen which is included within light pen circuitry 32 is coupled to storage oscilloscope 28 by the photo-optical transfer of a sweepbeam generated by x-y drive board 24 as described in greater detail below.

FIG. 1 illustrates the environment of the improvements of the present invention. Therefore, no other attempt will be made to exhaustively detail the specific coordination and operation of various elements illustrated in FIG. 1 other than as set forth above since the description of such detail would be largely irrelevant to the improvements which comprise the present invention and since such additional detail falls within the ambit of ordinary engineering design principles well understood in the art.

Figure 2:
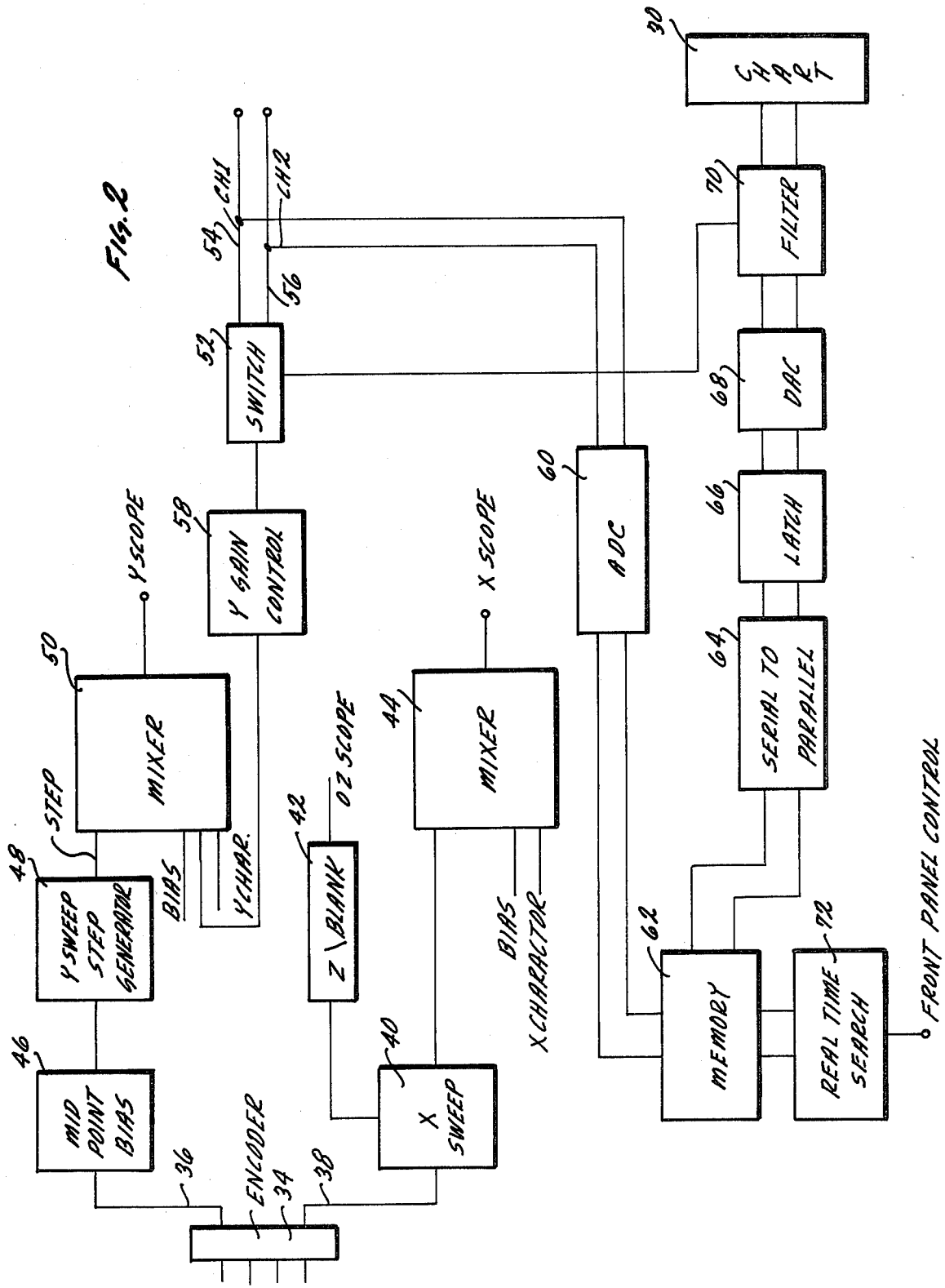
FIG. 2 is a simplified block diagram of the circuitry which comprises the x- and y-sweep circuitboard shown in FIG. 1.

FIG. 2 illustrates in greater detail a portion of the circuitry included within x-y drive board 24. The x-y drive board includes an encoder 34 which has a plurality of inputs coupled to appropriate logic circuitry within front panel control 22 and/or control logic 20. The plurality of inputs to encoder 34 are a plurality of discrete command signals, many of which have only internal significance, which are generated according to the mode of operation and the display format manually selected by the user. Encoder 34 translates the combination of discrete command signals appearing at its inputs into a binary word or code which is coupled to buses 36 and 38 for processing and use by circuitry, to be described below, which will ultimately result in the appropriate x and y drive signals for oscilloscope 28.

Consider first the binary word coupled to bus 38. The binary word on bus 38 is the input to an x-sweep circuit 40 which generates a sawtooth which serves as the basis for the x-sweep signal which will ultimately drive the trace of the single beam storage oscilloscope 28. The output of x-sweep circuit 40 is coupled to a conventional z blanking circuit 42 which in turn generates the z signal or the blanking signal which controls the on-off or brightness of the trace of scope 28 according to conventional principles. In other words, circuit 42 senses from x-sweep circuit 40 when the end of the line has been reached to thus blank the trace for a blind return sweep to the left hand side of the scope. The output of x-sweep circuit 40 is also coupled to a mixer circuit 44 which is used to modify the signal generated by x-sweep circuit 40 according to a designed bias and the x drive of specific characters which are to be written under the control of character generator 26. The output of mixer 44 is the x drive for oscilloscope 28.

Similarly, bus 36 is coupled to a midpoint bias circuit 46 described in greater detail below. Bias circuit 46 automatically picks the exact midpoint bias of the range of y-sweep signals regardless of the number of steps in the vertical direction which may be displayed on scope 28. For example, as stated 5, 10 or 60 minute segments of continuous ECG signals may be displayed on the screen, in each case using the same x and y dimension. The display is centered by midpoint bias circuitry 46 regardless of how many lines are vertically spaced on the display. The output of circuit 46 is coupled to a y-sweep circuit 48 similar to x-sweep circuit 40 and as described in greater detail below. As before, the output of y-sweep circuit 48 is coupled to a conventional mixer 50 wherein bias and y-character drive signals from character generator 26 are mixed to produce the ultimate y drive signal for scope 28.

ECG data read from the magnetic tape by tape deck 10 is coupled through preamplifier 16 to a conventional electronic switch 52. Channel 1 ECG data is coupled to line 54 and channel 2 ECG data is coupled to line 56. Lines 54 and 56 serve as the input to switch 52 whose output in turn is coupled to a conventionally designed y gain control circuit 58. Y gain control circuit 58 is coupled to and is responsive to signals received from front panel control 22 so that the gain or magnitude of the y-sweep of each vertical step is appropriately controlled according to the operating mode and display format chosen by the user. The output of gain control circuit 58 in turn is coupled to mixer 50 as one of its inputs to appropriately control the y-sweep signal for scope 28.

As stated, the system also has the capability of providing for a hard copy output on chart recorder 30. ECG data from channels 1 and 2 are directly coupled through lines 56 and 54 to an analog-to-digital convertor 60. The digital output of convertor 60 is coupled into serial format to a memory 62 wherein each channel is separately stored. Thus, the entire page to be displayed for each of the input channels is stored and available in memory 62 for later random access. When operating in the auto report mode, the contents of memory 62 are selectively transferred in serial format to serial-to-parallel convertor 64 which assembles binary words representative of each sampled data element from the ECG waveform and transfers the binary words for each channel to a conventional latch 66. A digital-to-analog convertor 68 in turn converts the information held within latch 66 into analog form and transfers it to a conventionally designed filter 70, which filters out high frequency noise or other undesirable signals which may be introduced by the sampling. The output of filter 70 is then coupled to chart recorder 30 for hardcopy printout.

As previously described the present invention is capable of handling a multiple of channels of continuous ECG waveform with high fidelity. This operation is accomplished as follows. ECG data on channel 1 is coupled directly through switch 32 as it is read from the magnetic tape to the y drive signal of scope 28 in the manner described above. At the same time, ECG data is being read on channel 2 and is coupled through line 56 to memory 62 as also described above. After all the ECG data is displayed on scope 28 from channel 1 that portion of memory 62 containing channel 2 information is then read and displayed by x-y circuitboard 24. This is accomplished by reading channel 2 data from memory 62 through filter 70 as described and directly coupling the data to the y drive from the output of filter 70 through electronic switch 52. Conventional logic circuitry may be included within control logic circuit 20 or x-y board 24 for this two phase display protocol. Thus, the two channels of information are displayed sequentially: channel 1 data being displayed as it is read from the magnetic tape; and channel 2 data being immediately displayed thereafter by a memory dump. Therefore it is not necessary to constantly switch back and forth between two data sources in order to have a complete display of the multiple channels of information, displayed in a corrolated manner in an x-y array. The channel 1 data is written, for example, on all the odd numbered vertical steps on the two dimensional display while the channel 2 data is written on all the even numbered vertical steps in the display. What results is a display wherein the horizontal lines of ECG data are alternated in the display as the viewer looks up or down the screen. The time corrolation between the channel 1 and channel 2 data is also accurate. In other words, if lines 1 and 2 held the first two horizontal lines of channel 1 and channel 2 data, each point on line 1 and 2, as the eye moved horizontally across the screen, would correspond to the same actual time-of-day of the recorded event for each channel as recorded on the magnetic tape. No data is chopped from or missing from either channel, which would occur if short intervals of data were traced on alternating lines in an operation which rapidly multiplexed or switched between channels 1 and 2 for each line pair.

The circuitry of FIG. 2 also includes a real time search circuit 72 coupled to memory 62 which selectively causes a portion of memory 62 to be read and displayed on scope 28 or chart 30 in response to discrete command signals from front panel control 22. Logic circuitry designed according to well understood principles are included within search circuit 72 to calculate and generate the appropriate address within memory 62 as well as corresponding secondary, discrete command signals which may be necessary for the coordinated operation of the other circuit elements shown in FIG. 2 to display exactly that portion of the data on scope 28 according to a second display format designated by the user and manually input into front panel control 22. Thus, when in the tape search mode, selected ECG events, identified by their time-of-day annotation, are selected by the user and displayed in a selected format. Generally, the user may note a sequence of abnormal signals contained within a one hour display on scope 28. For example through the time annotations provided by character generator 26 in the one-hour display format, the user will identify the approximate time of an abnormal sequence and expand the waveform display to a five-minute display centered around the identified, abnormal sequence. Therefore, the entire screen then becomes automatically filled with just that five minutes of data which includes the abnormal sequence.

Figure 3:
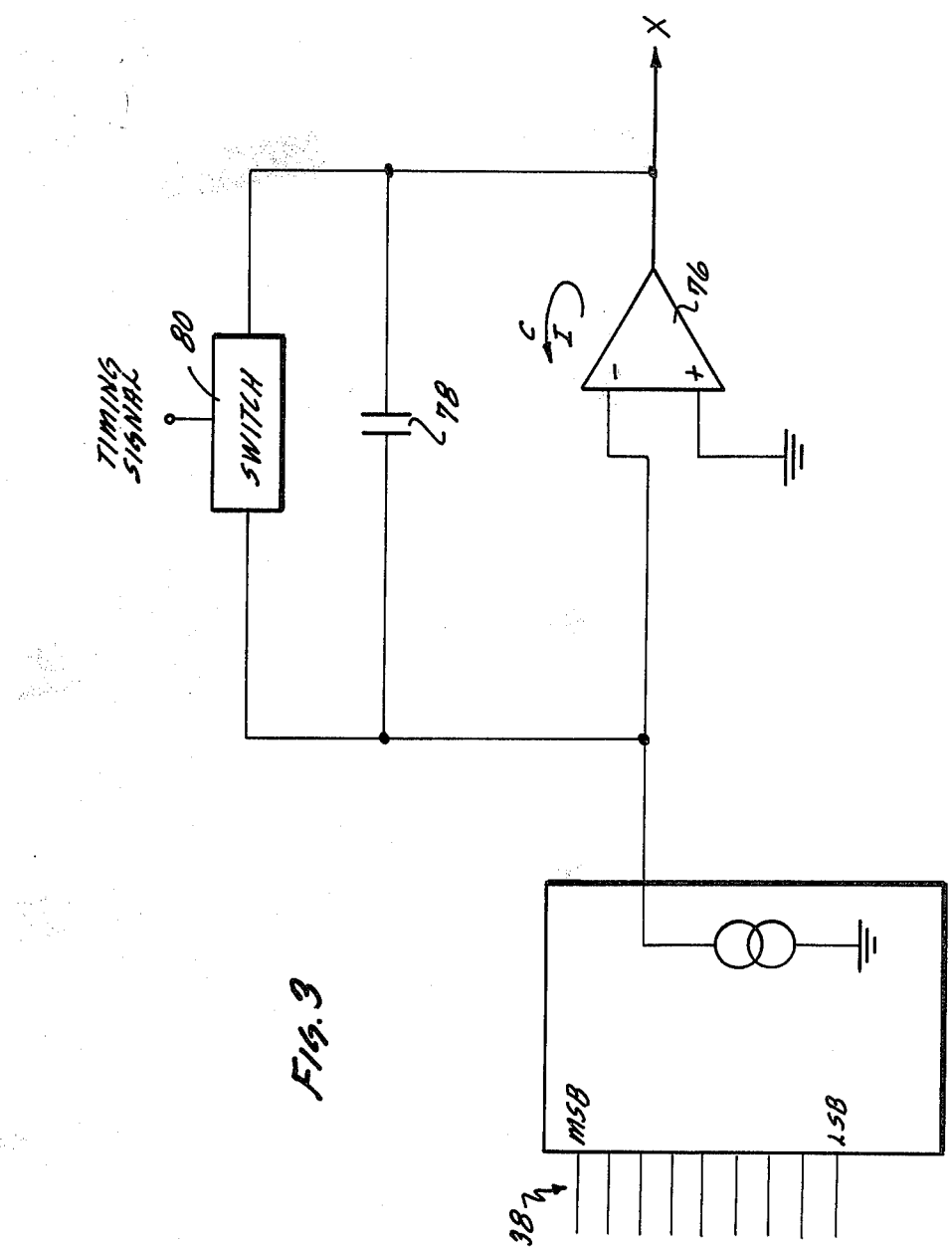
FIG. 3 is a simplified block diagram of a y-sweep generator of the type used in FIG. 2.

FIG. 3 illustrates one improvement of the present invention which is included within x-sweep circuitry 40 as shown in FIG. 2. Bus 38 is coupled to the input of a digital-to-analog convertor 74. The output of convertor 74 is coupled to the input of a conventional sawtooth generator 76. The amplitude of the x-sweep is controlled in a conventional manner by feedback element 78, in this case capacitor, while the periodicity of sawtooth, generated by generator 76, is controlled by an electronic switch 80. Switch 80 in turn is responsive to an internal timing signal which has a frequency selected as may be appropriate to the oeprating mode and display format and as generated by front control panel 22 and/or control logic circuitry 20. Whereas prior art sawtooth generators generally relied on an input current derived from a variably controlled analog circuit, the present invention has utilized the discretely controlled analog output of a digital-to-analog convertor to generate the control current to the sawtooth generator derived from a binary word generated by encoder 34 of FIG. 2. Thus, an arbitrarily selected input current to sawtooth generator 76 may be provided with the flexibility which is inherent to digital processing and encoding techniques.

Figure 4:
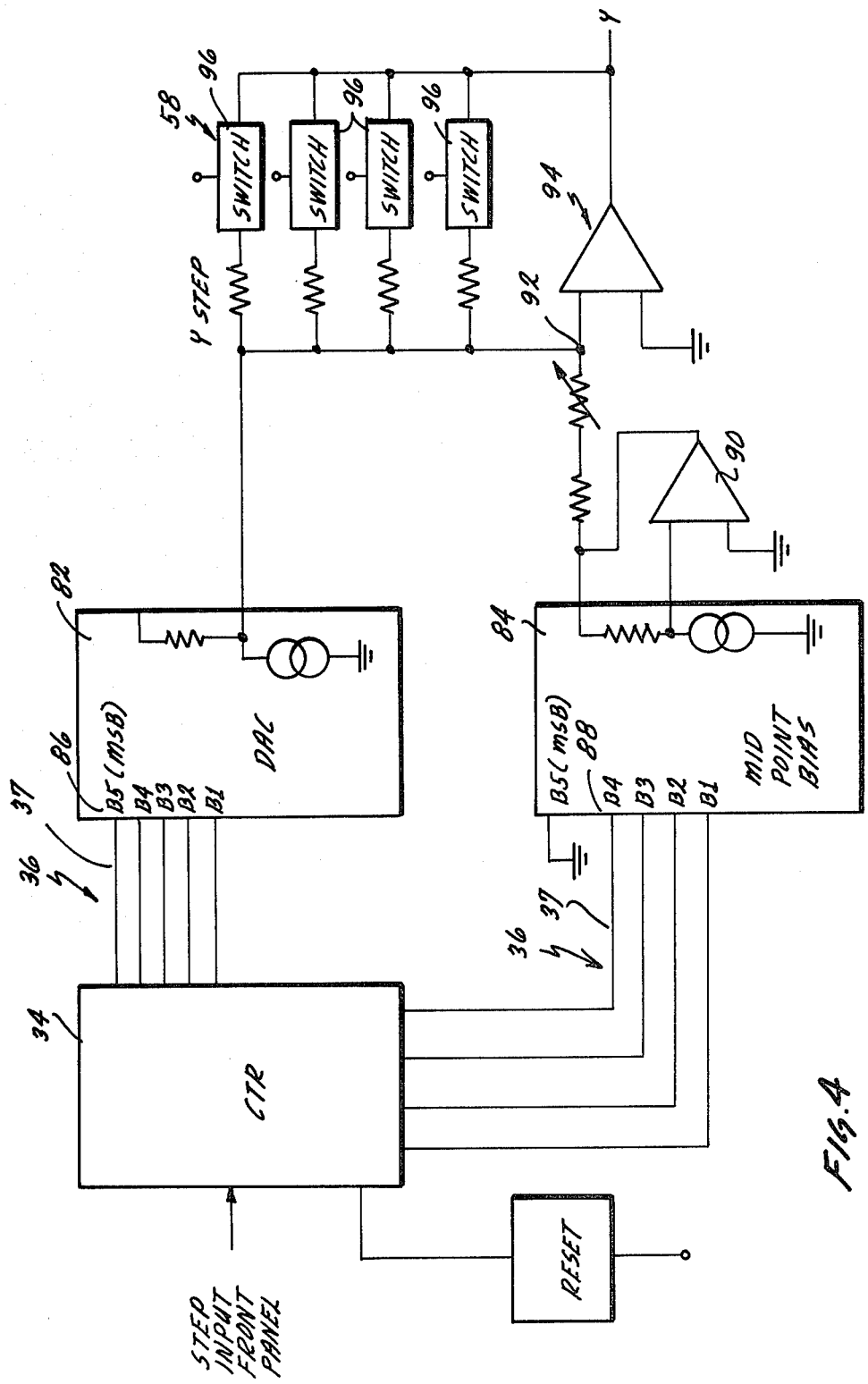
FIG. 4 is a simplified block diagram of a x-sweep generator of the type used in FIG. 2.

FIG. 4 illustrates a similar application of the present invention in y-sweep circuit 48 of FIG. 2. Encoder 34 is shown as communicating through bus 36 to a conventional digital-to-analog convertor 82 and 84. However, bus 36 is split or duplicated and is independently coupled to both convertors 82 and 84. The coupling of bus 36 to convertors 82 and 84 is distinguished in that the coupling of bus 36 to convertor 84 is shifted one binary bit downward as compared to the coupling of bus 36 to convertor 82. In other words line 37 of bus 36 carrying the most significant bit of the binary word generated by encoder 34 is coupled to that input of the digital-to-analog convertor 82 which corresponds to the most significant bit (MSB) of the input word. In contrast, line 37 of bus 36 coupled to digital-to-analog convertor 84 is coupled to an input of convertor 84 which corresponds to the binary bit of the input which is one binary order of magnitude less than the binary bit corresponding to the next higher input bit (B4). More particularly, bus 36 in the illustrated embodiment is comprised of five lines representative of five bits. The most significant bit of bus 36 coupled to convertor 82 is coupled to input 86, while the most significant bit on bus 36 coupled to convertor 84 is coupled to input 88. The input of digital-to-analog convertor 84 corresponding to input 86 of convertor 82 is grounded.

Therefore the number which digital analog convertor 84 reads is half the value of the number which is read by convertor 82. The output of this midpoint bias generated by convertor 84 is coupled through a conditioning amplifier 90 to a node 92. The output of convertor 82 is also coupled to node 92 which is the input of a conventional sawtooth generator 94. Sawtooth generator 94 has its feedback provided by y gain control circuit 58 which is diagramatically illustrated in FIG. 4 as being comprised of a plurality of feedback loops each having an electronic switch 96 appropriately controlled by discrete command signals generated by front panel control 22 or control logic 20. Each feedback loop has a different electrical or resistive characteristic thereby altering both the periodicity and height of the sawtooth generated by sawtooth generator 94. The output of generator 94 is the y-sweep signal for scope 28.

The embodiment in FIG. 4 illustrates the ease and flexibility which can be achieved by using a digital-to-analog convertor as a current source for a sawtooth generator. Thus, regardless of the particular binary word generated by encoder 34, digital-to-analog convertor 84 always takes the exact midpoint about which to bias the center of y-sweep driving signal. Many other manipulations could be digitally introduced through the use of such digital analog convertors to provide selective control of a analog signal without departing from the scope of the invention.

FIG. 5 illustrates in greater detail some of the circuitry included within character generator 26 of FIG. 1. The operation of the circuitry of FIG. 5 is organized around and controlled by a program counter 96. Program counter 96 is simply a counter which is selectively controlled by synchronization circuitry 98 and state circuitry 100. Synchronization circuitry 98 and state circuitry 100 coordinate the timing and set counter 96 to the start and stop limits as may be required according to the operation mode and display format manually input through front panel control 22. Pagination information and tape deck control information in the form of a plurality of internal discrete control lines are coupled as inputs to synchronization circuit 98 and state circuit 100. The exact design and configuration of synchronization circuits 98 and state circuits 100 are derived according to well understood engineering principles.

Program counter 96 generates memory addresses which are generated in sequence according to the timing and limits defined by circuits 98 and 100 and according to activation either by a write clock 102 or a read strobe signal 104 derived from either state circuit 100 or front panel control 22. In either case, the write command signal from clock 102 or state circuit 100 is coupled as an input to electronic gate 106 whose output in turn is coupled to counter 96. Similarly, read strobe 104 or the read pulse from state circuit 100 is coupled to an electronic gate 108 which also has its input coupled to counter 96. Gates 106 and 108 may in turn be controlled by discrete command signals from synchronization circuit 98 or front control panel 22 as may be appropriate.

The memory address is generated by counter 96 is coupled to a plurality of memories, namely RAM 110, data PROM 112 and control PROM 114. The address coupled from counter 96 to control PROM 114 is translated into an instruction contained within the lookup table within control PROM 114 which in turn is coupled to a control decoder 116. Control decoder 116 has a plurality of outputs coupled as control lines or command lines to data PROM 112, RAM 110 and time byte circuit 118.

The activation or operation of each of these circuits is controlled by control decoder 116 which implements the instruction read from control PROM 114. Time byte circuitry 118 is coupled to time-of-day circuit 12 of FIG. 1 and generates a time-of-day byte representative of the time-of-day at which the event, then being read by tape deck 10, occurred. Specifically stored data within data PROM 112, such as alphanumeric information relating to the patient's identity and other file data is then selectively transferred to RAM 110 as well as the time-of-day data from circuit 118. RAM 110 is appropriately loaded with annotation data as may be required while program counter 96 merely steps through the program listings as stored within control PROM 114.

Some of the information which is stored within RAM 110 will necessarily be read directly from the magnetic tape, such as the specific identity of the patient and other information which may vary from record to record. Alphanumeric information which is identical in each display format will be permanently stored in data PROM 112. RAM 110 is thus loaded in part from internal fixed memories, in part from computed or generated time-of-day annotations, and in part directly from the tape input according to conventional principles. Information which is written into and read from RAM 110 is coordinated by the combination of program counter 96 and control PROM 114 operated in combination with synchronization circuits 98 and state circuits 100 to achieve the desired, ordered result. Again, the specific details of such operation are not described here inasmuch as their implementation and the details of the circuitry are derived from well understood software and hardware design principles.

Once RAM 110 is fully loaded, stored information can be selectively read out under program control onto bus 120 and provided as an input to conventional dot matrix encoder 122. The program counter clock 102 is divided down through a frequency divider 124 to provide an input to a vertical counter 126. Vertical counter 126 in turn provides the driving input signal for dot matrix encoder 122 and the x and y driving signals for the character annotations which are coupled to mixers 44 and 50 described in connection with FIG. 2. Dot matrix encoder 122 generates the z axis signal for scope 28, namely an on-off or brightness control for the trace of scope 28 which appropriately traces the annotation on the display screen at the x and y points as dictated by the x and y character drive signals. The y character drive signal is derived from a digital-to-analog converter 128 whose input is coupled to vertical counter 126. The output of converter 128 is coupled to an operational amplifier and conditioning circuit 130 to provide the appropriate voltage levels and currents required for the y character drive input of mixer 50. The generation of x- and y-sweep signals by circuits 40 and 48 in FIG. 2 are coordinated through clock 102 and/or vertical counter 126 such that the overall x- and y-sweep of the trace of the scope 28 is synchronized with the generation of the x and y character drive signals.

Vertical counter 126 is also coupled to the input of a horizontal counter 132 whose output in turn is coupled to a digital analog convertor 134 for generation of an appropriate x character drive signal for the input of mixer 44 of FIG. 2. In the illustrated embodiment, the characters are traced on the screen by dot matrix encoder 122 on a column-by-column basis. In other words, the field on which any alphanumeric character can be printed is comprised of a fixed number of dots forming an array of rows and columns. Vertical counter 126 steps through each of the dots for each column in the array. Horizontal counter 132 counts the number of dots through which vertical counter 126 steps. After the end of the column is reached, horizontal counter 132 will reset such that the next vertical dot counted will be horizontally shifted to the adjacent column. For this reason, vertical counter 126 serves as an input drive for horizontal counter 132 to coordinate the printing of the character annotation in the array.

The tachometer pulse from tape deck 10 as well as a plurality of discrete command signals from front panel control 22 are coupled to a conditioning circuit 101 included within character generator 26 to generate a plurality of internal state or condition signals. Some of these signals are coupled directly to x-y driver board 24 and are generated on the character generator board 26 only as a matter of convenience. Other ones of these state or condition signals are used within character generator 26 in an end of line counter 103 which identifies the end of a horizontal line of ECG data according to the limits designated by front control panel 22. End of line counters 103 is coupled as an input to state circuits 100 to serve as an input whereby circuit 100 may logically generate its read and write control signals for the benefit of the remaining circuit elements shown in FIG. 5. End of line counter 103 also generates a reset signal which is coupled to x-y drive board 24 to generally reset the x-and y-sweep circuitry and to initialize the circuitry in preparation of the sweep of a succeeding horizontal line of ECG data.

Character generator 26 also includes the circuitry illustrated in FIG. 6. The circuitry of FIG. 6 is a marking means whose design and operation is similar to the character generator described in connection with FIG. 5. As before, operation of the marker generator is based on a program counter 136. The operation of program counter 136 is initiated and limited by synchronization circuitry 138 and state circuitry 140 in a manner similar to the regulation of program counter 96 by synchronization of circuit 98 and state circuit 100 of FIG. 5. Synchronization circuit 138 in turn has its inputs coupled to tape deck 10 so that the output of the marker generator is synchronized and coordinated with the reading of ECG data from the magnetic tape. In fact, program counter 136 may in fact be the same vertical counter as used in x-y board 24 to control the overall repetition of the x and y drive signals to scope 28. In any case, counter 136 is appropriately driven by the tachometer pulse which is coupled thereto through electronic switch 142 or by an internal clock 144 which may be the same as or synchronized to clock 102 of FIG. 5 and which is coupled to counter 136 through electronic switch 146. Switches 142 and 146 are controlled in each case by a read signal generated by state circuit 140.

As before program counter 136 merely steps through the addresses of memories 148 and 150. Each of the memories 148 and 150 contain an identification marker of a specific abnormality type corresponding to each waveform displayed on scope 28. Each memory address corresponds to a point on scope according to the selected display format. As the ECG data is being read the arrhythmia computer detects each heartbeat, determines whether or not it is abnormal and then categorizes the type of abnormality, if any. A VE signal or SVE signal will be generated by the arrhythmia computer and loaded into RAM 148 and 150 respectively at the appropriate location as determined by program counter 136 when operated by state circuit 140 during the write phase. After one full page of display data has been read from magnetic tape deck 10, RAMS 148 and 150 will be filled with zeros and ones, a zero hypothetically signifying a waveform location detected as normal and a one hypothetically signifying a location of the waveform detected as abnormal and as a ventricular ectopic or superventricular ectopic event.

During the read mode, RAM 148 and 150 will each be read by program counter 136 under the control of synchronization circuit 138 and state circuit 140. The output of RAMS 148 and 150 provide the input for a test circuit 152 which determines whether or not a zero or one is being output from the respective memory. If a one is coupled to the output, a stop signal is generated by test circuit 152 which stops and holds the operation of program counter 136. A command signal is then generated by test circuit 152 to a character generator subassembly circuit 154 which will generate a arbitrarily selected marker character on the display screen of scope 28. In the case of a ventricular ectopic event, the marker "VE" is generated and positioned next to the ventricular ectopic abnormal beat displayed on the screen. Similarly, an "SVE" marker is generated and appropriately positioned next to the superventricular ectopic abnormal beats.

Character generator subassembly 154 is similar to the character generators circuitry illustrated in FIG. 5. Namely, circuit 154 includes its own program counter and data PROMS for generating the appropriate alphanumeric markers. The x, y and z signals required to trace the marker character are appropriately generated by a dot matrix encoder in a combination of digital-to-analog convertors and counters in circuit 154 of the same type and organization as were used in FIG. 5 to generate the annotation characters. The character generator subassembly 154 has been shown only in a simplified block diagram for the expedient of clarity since its internal organization can easily be constructed according to the principles described in connection with the annotation character generator of FIG. 5.

The overall x- and y-sweep of the marker generator of FIG. 6 is independent of the x- and y-sweep of the annotation character generator and x-y drive board 24 described in connection with FIG. 2. Therefore, program counter 136 is coupled to digital-to-analog convertors 156 and 158 whose output in turn may be coupled through conventional signal conditioning circuitry (not shown) respectively to an x-sawtooth generator 164 and a y-sawtooth generator 166 respectively. Sawtooth generators 164 and 166 generate the overall x- and y-drive signals for scope 28 with respect to the marker characters and simply select the center position on the display where the marker character will be traced. The actual fine control of the trace to paint the marker character "VE" or "SVE" is accomplished by biasing the input to sawtooth generators 164 and 166 by the appropriate output of character generator subassembly 154.

The circuitry of FIG. 6 in combination with the previously described circuitry of FIGS. 1-5 illustrates one aspect of the present invention. ECG data is traced on the scope display in a three pass operation. During the first pass or time interval, the ECG waveform data is traced on the display of storage oscilloscope 28 by the x- and y-sweep circuitry included within x-y driver board 24 as described in detail in connection with FIG. 2. On a second pass or time interval, the annotation characters are traced on the display of the storage oscilloscope by the circuitry specifically described in connection with FIG. 5. During a third pass or time interval, the abnormality markers are appropriately positioned on the display next to abnormal events in the ECG waveform by the circuitry of FIG. 6. Although this operation can ensue so quickly that the observer is not aware of the three pass process, it has been determined that users prefer the process to be slowed such that each phase can be distinctly followed by the eye. Therefore, the display is structured in the preferred embodiments such that each pass requires one to three seconds to accomplish.

First the ECG waveform data is traced line by line on the display. The operator watches the waveform traces as they are painted and is able to form a visual impression as to whether or not the page of displayed data contains any events of interest. In other words, the eye is lead by the oscilloscope trace in time sequence such that the entire page of data is produced in the same order as its real time chronology except that it is reproduced in the space of one to three seconds.

Next, patient information and time-of-day annotations are added along the top display and on the left hand margin next to each one or selected ones of the horizontal lines of data. Again, this allows the user to read the patient information as it is written on the screen and to recognize, during the display process, what interval of real time to which the data is correlated.

Finally, the abnormality markers are displayed on the screen in the same order as the waveform data was traced and the eye of the user is led to those events which the arrhythmia computer has detected as abnormal and to the type of abnormality which it has determined.

Therefore, after the three to ten seconds required to present the entire display, the user has read all the data on the screen and has begun a cognitive process as to what event or further display of the data, or what additional display of other data may be desired in order to derive a conclusion relating to the cardiological diagnosis of the patient.

It is of course possible that the phase of operation during which the markers are traced could proceed the phase of operation during which the annotation characters are traced. Despite the fact that only two markers are described in this embodiment, it is entirely within the scope of the present invention that many additional symbols could be included. For example, a third memory having the mark in the form of a question mark could be included to mark those cardiac events which the arrhythmia computer recognizes as abnormal but which it cannot recognize as being either a ventricular or superventricular ectopic event.

FIG. 7 illustrates greater detail concerning light pen circuit 32 of FIG. 1. As is the case with respect to the circuit organization of the annotation character generator of FIG. 5 and the marker character generator of FIG. 6, the operation of light pen circuit 32 is based on a horizontal and vertical program counter 168. Program counter 168 is initialized and limited by format signals generated by a state circuit 170 which in turn has its inputs coupled to the plurality of discrete command signals from front panel control 22. Program counter 168 is in turn driven by an internal clock 172 selectively coupled to counter 168 through an electronic switch 174. Switch 174 is operated in response to appropriate control signals from panel control circuit 22 which would be activated when the light pen was used.

The line count and vertical step count from counter 168 is coupled to an x- and y-sweep generator 176 having the same internal organization and operation as the x and y sweep generator illustrated in connection with FIG. 2 which is included on x-y drive board 24. Although the internal design of generator 176 has been diagramatically shown in FIG. 7, a detailed description will be omitted here since its operation is similar to that described in connection with the x- and y-sweep generator of FIG. 2.

When the light pen is activated, a search spot retraces the two dimensional raster according to the selected display format. A hand-held photo-detector 178, mechanically packaged in the form of a pen, is placed by the user on the screen at that point on the display which the user desires to identify for further search, output or video display. Upon detection of the trace, photo-detector 178 will generate a stop and hold signal which is communicated to program counter 168. Receipt of the stop and hold signal will temporarily halt the operation of program counter 168 while a microprocessor unit or equivalent logic circuitry 180 computes the location of identified event, typically the memory address of the event as stored in memory 62 of FIG. 2. The computed memory address is then stored in a scratch memory 182 after which operation of counter 168 is continued. Restart may be automatically initiated by generation of a restart signal from processor 180 to counter 168, or may be started manually through an interactive process with the user. For example, processor unit 180 may light an indicator lamp when it has stored the desired location within memory 82 thereby signaling to the user to press a button, included within the pen of photo-detector 178, to restart counter 168.

After the user has identified each of the events desired by use of the light pen, any one of the various operational of modes of the system may be selectively entered and the identified events stored within memory 182 displayed in a format as dictated by the user through appropriate input to front panel control 22.

Since storage oscilloscope 28 maintains a constant field of background brightness, it is necessary for the light pen to pick out the moving trace generated by the circuitry of FIG. 7 from the background. Thus, photo-detector 178 includes threshold detection circuitry which is able to detect a slight differential increase of intensity as the trace spot traverses the field of the pen, although the variation of intensity is otherwise unnoticed by the human eye. Alternatively, it may be possible to modulate the trace intensity in which case photo-detector circuit 178 would include a means for detecting the signature of the modulation of the trace from the unmodulated background light on the screen.

Although the present invention has been described in connection with a particularly illustrated embodiment, it must be understood that many modifications may be made by those having ordinary skill in the art without departing from the spirit or scope of the present invention. Indeed, other various modes of operation which might be desired by users could be easily accommodated and incorporated within the present invention without any substantial departure from the basic design concepts and simply by including specific logic and control circuitry within panel control 22 and control logic circuit 20.

I claim:

1. An improvement in a system for processing predetermined physiological signals in combination with an oscilloscope display and a fixed medium, said improvement comprising:

means for defining a first, second and third interval;

means for displaying said signals in one of a plurality of display formats during said first time interval on said oscilloscope display when said signals are read from said fixed medium, said signals being displayed in said oscilloscope display from said fixed medium at a rate greater than the rate at which said signals occurred in real time;

means for annotating said signals with a predetermined parameter according to said one of said plurality of display formats during said second time interval subsequent to said first time interval; and means for marking said signals in said one format to identify a plurality of detected physiological events corresponding to portions of said signals during said third time interval subsequent to said first time interval, each of said means being mutually coupled to coordinate displaying, annotating and marking in said one display format, whereby an annotated and marked display of physiological signals corresponding to a long period of time can be displayed, analyzed and marked in a substantially shorter period of time by a system of minimal complexity.

2. The improvement of claim 1 wherein said means for marking during said third interval of time marks said signals subsequent to when said means for annotating annotates said signals during said second interval of time.

3. The improvement of claim 1 wherein said means for annotating annotates said signals during said second interval of time subsequent to when said means for marking marks said signals during said third interval of time.

4. The improvement of claim 1 wherein said means for marking includes:

synchronization and state circuitry to synchronize and conform operation and timing of said means for marking to said one display format;

a program counter for counting and initiating execution of a multiplicity of display steps in said one display format, said program counter coupled to said synchronization and state circuitry to conform said counting in said program counter to said one display format;

a plurality of memories coupled to said program counter for storing ones of said steps corresponding to said detected physiological events, each one of said plurality of memories corresponding to one of said plurality of detected physiological event;

a test circuit coupled to said memories for determining if said step currently being executed by said program counter corresponds to one of said detected physiological events, said test circuit generating a stop signal to temporarily stop operation of said program counter if said step is indicative of one of said detected physiological events;

character generator means for generating a marker signal indicative of said one detected physiological event when determined by said test circuit, said character generator means being coupled to said test circuit; and means for generating x- and y-sweep signals for said oscilloscope display, said means for generating x- and y-sweep signals being coupled to said program counter.

5. The improvement of claim 1 wherein said means for annotating said signals includes:

synchronization and state circuitry to synchronize and conform operation and timing of said means for annotation to said one display format;

a program counter for counting and initiating execution of a multiplicity of display steps in said one display format, said program counter coupled to said synchronization and state circuitry to conform said counting in said program counter to said one display format;

a control program memory coupled to said program counter for storing a plurality of instructions corresponding to said plurality of display formats;

a control decoder coupled to said control program memory to generate a plurality of command signals corresponding to said plurality of instructions;

a memory coupled to said program counter and control decoder for storing a plurality of characters to annotate said signals; and means for generating x-sweep and y-sweep, and beam intensity signals, said means coupled to said memory and to said synchronization and state circuitry to selectively generate said characters to annotate said signals on said oscilloscope display.

6. The improvement of claim 1, 4 or 5 wherein said means for displaying said signals includes a storage means for delayed displaying of said signals, and at least processing said signals in preparation for display in one of a plurality of display formats;

displaying said signals during said first time interval on said oscilloscope in said one of said plurality of display formats;

generating a parameter;

annotating during said record time interval said signals with said parameter according to said one display format;

detecting a plurality of physiological events;

marking during said third time interval said signals as determined by said one display format to identify a plurality of said detected physiological events, whereby an annotated and marked display of physiological signals can be generated at said greater rate on a single beam oscilloscope with minimal circuit complexity and maximal fidelity.

7. The improvement of claim 6 wherein said means for receiving, processing and displaying includes means for display signals on said first and second input channels on alternate horizontal lines of said oscilloscope display.

8. An improvement in a method for displaying annotated physiological signals on single beam oscilloscope at a rate substantially greater than the rate at which said signals occurred in real time, said signals being marked relative to a plurality of detected physiological events and displayed in one of a plurality of display formats, said improvement comprising the steps of:

receiving, processing and displaying said signals during a first time interval on said oscilloscope in said one of said plurality of display formats;

annotating said signals with a parameter according to said one display format during a second time interval; and marking said signals according to said one display format to identify a plurality of said detected physiological events during a third time interval, whereby an annotated and marked display of physiological signals can be generated at said greater rate on a single beam oscilloscope with minimal circuit complexity and maximal fidelity.

9. The improvement of claim 8 where said step of annotating during said second time interval is prior to said step of marking during said third time interval.

10. The improvement of claim 8 where said step of marking during said third time interval is prior to said step of annotating during said second time interval.

* * * * *